(12) United States Patent
Delp

(10) Patent No.: US 7,115,211 B2
(45) Date of Patent: Oct. 3, 2006

(54) ENDPOINT DETECTION USING LASER INTERFEROMETRY

(75) Inventor: Deana R. Delp, Tempe, AZ (US)

(73) Assignee: Tokyo Electron Limited, Tokyo (JP)

( * ) Notice: Subject to any disclaimer, the term of this patent is extended or adjusted under 35 U.S.C. 154(b) by 92 days.

(21) Appl. No.: 10/916,386

(22) Filed: Aug. 12, 2004

(65) Prior Publication Data

US 2005/0087515 A1 Apr. 28, 2005

Related U.S. Application Data

(60) Provisional application No. 60/494,555, filed on Aug. 13, 2003.

(51) Int. Cl.
*G01L 21/30* (2006.01)
*H01L 21/00* (2006.01)

(52) U.S. Cl. .......................... 216/59; 216/60; 438/14; 219/121.6

(58) Field of Classification Search .................. 216/59, 216/60; 219/121.6; 438/14
See application file for complete search history.

(56) References Cited

U.S. PATENT DOCUMENTS

| 4,454,001 | A | * | 6/1984 | Sternheim et al. | ............ 216/60 |
| 5,632,855 | A | * | 5/1997 | Jones et al. | ................. 438/714 |
| 6,172,329 | B1 | * | 1/2001 | Shoemaker et al. | ... 219/121.69 |
| 2002/0023329 | A1 | * | 2/2002 | Nulman | ..................... 29/25.01 |

* cited by examiner

*Primary Examiner*—Shamim Ahmed
(74) *Attorney, Agent, or Firm*—Oblon, Spivak, McClelland, Maier & Neustadt, P.C.

(57) ABSTRACT

A method and system for determining an endpoint in a (near) real-time environment using statistical process control. By utilizing such control, an endpoint of a semiconductor process (e.g., an etch) can be monitored. Monitoring may lead to increased yields by avoiding or reducing error conditions (e.g., under- or over-etching).

7 Claims, 8 Drawing Sheets

(http://hyperphysics.phy-astr.gsu.edu/hbase/math/gaufcn.html
Gaussian Distribution Function)

ENDPOINT DETECTION USING LASER INTERFEROMETRY

CROSS REFERENCE TO RELATED APPLICATIONS

This application claims priority to and is related to U.S. Provisional Application Ser. No. 60/494,555, filed on Aug. 13, 2003. The content of this application is incorporated herein by reference.

BACKGROUND OF THE INVENTION

1. Field of the Invention

The present invention is directed to a method and system for determining an endpoint of a process in a semiconductor system, and more particularly to a method and system for using laser interferometry for endpoint detection.

2. Discussion of the Background

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

Semiconductor processing facilities require constant monitoring. Processing conditions change over time with the slightest changes in critical process parameters creating undesirable results. Small changes can easily occur in the composition or pressure of an etch gas, process chamber, or wafer temperature. Semiconductor processing is an example of a manufacturing process that requires close tolerances of the width of features produced on the wafer. It is important that the width of etched features during processing be controlled within certain critical dimension limits. In many cases, changes of process data reflecting deterioration of processing characteristics cannot be detected by simply referring to the process data displayed. Oftentimes statistical process control (SPC) is necessary to detect these slight changes.

Plasma etching is a fundamental technique used in integrated circuit fabrication. It is very important to determine when the endpoint of the etching process has been reached. If processing is stopped prior to the endpoint some of the etched layer remains. If over-etching occurs, lower layers of the integrated circuit wafer could be damaged. It is important to know when the nominal endpoint has been reached to achieve accurate and repeatable etching.

BRIEF SUMMARY OF THE INVENTION

Using laser interferometry (LIF), it is possible to visually detect a changing point for endpoint detection. Thus, it is an object of the present invention to utilize LIF for endpoint detection during the etching of a semiconductor layer.

According to one embodiment of the present invention, various point distribution curves can be developed. Although Gaussian curves are possible, other curves may be utilized based on previous knowledge/measurements.

According to another embodiment, a window of measurements may be used to update the distribution calculation. The resulting distribution is used for a statistical process control (SPC) chart to develop trends and predict problems.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF THE PREFERRED EMBODIMENT

Figure 1:
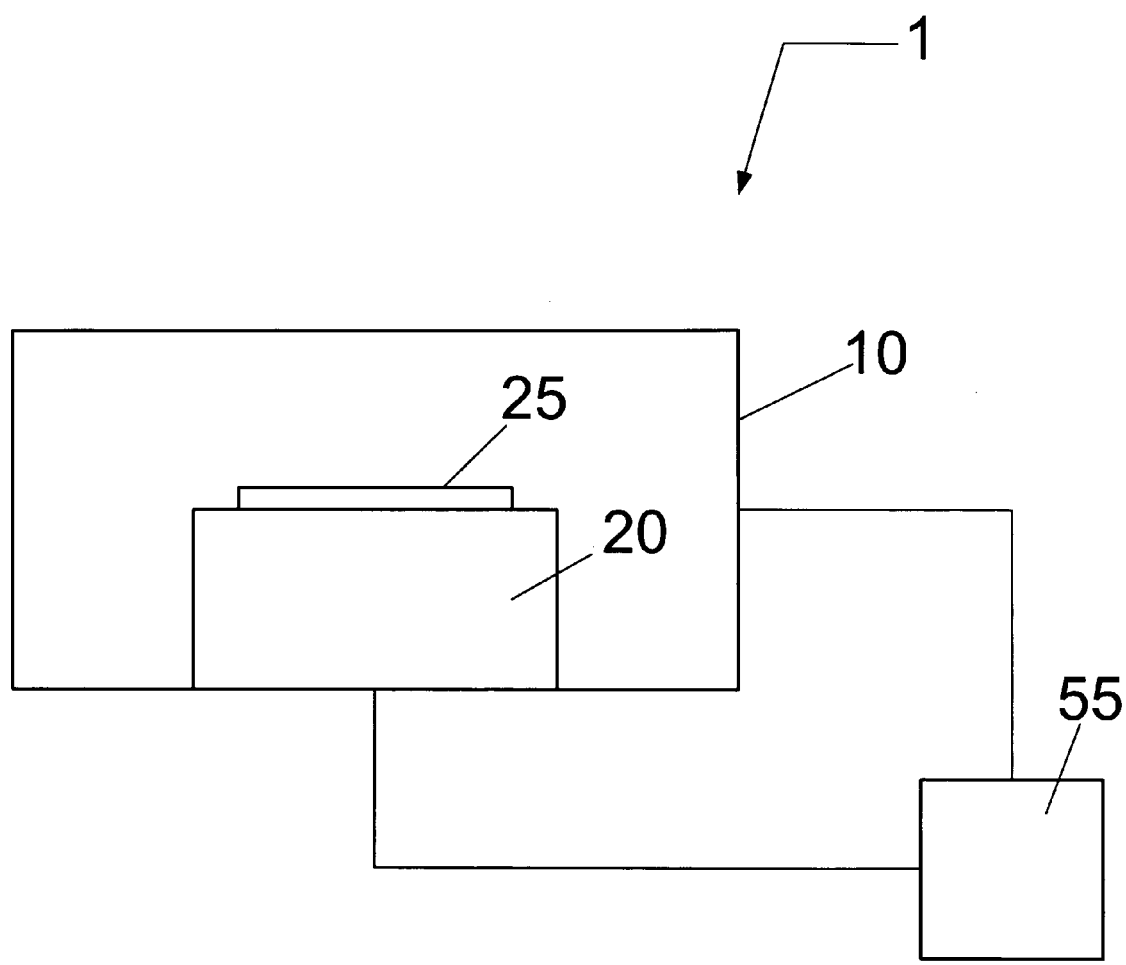
FIG. 1 illustrates a schematic block diagram of a plasma processing system according to an embodiment of the present invention.

According to an embodiment of the present invention, a material processing system 1 is depicted in FIG. 1 that includes a process tool 10 having a substrate holder 20 and a substrate 25 supported thereon. The substrate holder 20 is configured to provide temperature control elements for rapid adjustment of substrate temperature, wherein the temperature elements are spatially arranged in order to ensure a uniform substrate temperature. A controller 55 is coupled to the process tool 10 and the substrate holder 20, and is configured to monitor and control the substrate temperature.

In the illustrated embodiment depicted in FIG. 1, the material processing system 1 can include an etch chamber. For example, the etch chamber can facilitate dry plasma etching, or, alternatively, dry non-plasma etching. Alternately, the material processing system 1 includes a photoresist coating chamber such as a heating/cooling module in a photoresist spin coating system that may be utilized for post-adhesion bake (PAB) or post-exposure bake (PEB), etc.; a photoresist patterning chamber such as an ultraviolet (UV) lithography system; a dielectric coating chamber such as a spin-on-glass (SOG) or spin-on-dielectric (SOD) system; a deposition chamber such as a chemical vapor deposition (CVD) system or a physical vapor deposition (PVD) system; or a rapid thermal processing (RTP) chamber such as a RTP system for thermal annealing.

Figure 2:
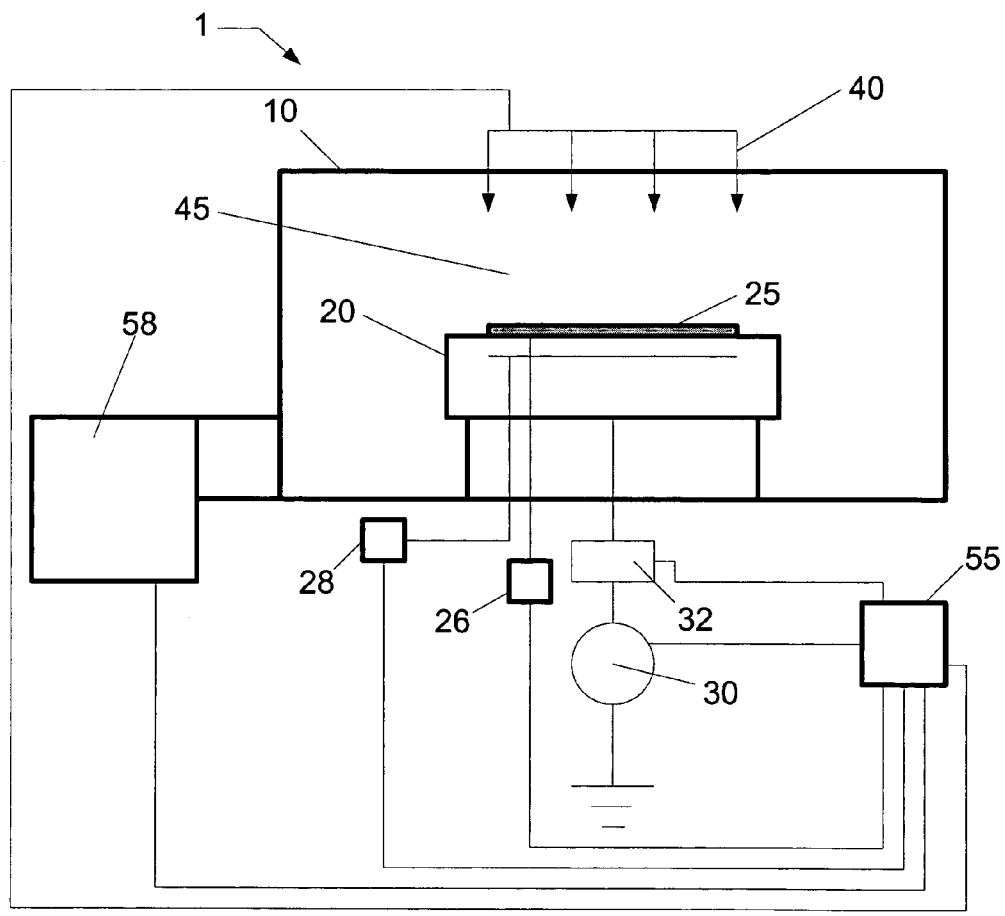
FIG. 2 presents an expanded cross-sectional view of a portion of a conventional substrate holder in a plasma processing system as shown in FIG. 1.

According to the illustrated embodiment depicted in FIG. 2, the material processing system 1 includes process tool 10, substrate holder 20, upon which a substrate 25 to be processed is affixed, gas injection system 40, and vacuum pumping system 58. Substrate 25 can be, for example, a semiconductor substrate, a wafer, or a liquid crystal display (LCD). Process tool 10 can be, for example, configured to facilitate the generation of plasma in processing region 45 adjacent a surface of substrate 25, where plasma is formed via collisions between heated electrons and an ionizable gas. An ionizable gas or mixture of gases is introduced via gas injection system 40, and the process pressure is adjusted. Desirably, plasma is utilized to create materials specific to a predetermined materials process, and to aid either the deposition of material to substrate 25 or the removal of material from the exposed surfaces of substrate 25. For example, controller 55 can be used to control vacuum pumping system 58 and gas injection system 40.

As shown in FIG. 2, substrate holder 20 can include an electrode through which RF power is coupled to plasma in processing region 45. For example, substrate holder 20 can be electrically biased at an RF voltage via the transmission of RF power from RF generator 30 through impedance match network 32 to substrate holder 20. The RF bias can serve to heat electrons to form and maintain plasma. In this configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, impedance match network 32 serves to maximize the transfer of RF power to plasma in processing chamber 10 by minimizing the reflected power. Various match network topologies (e.g., L-type, π-type, T-type, etc.) and automatic control methods can be utilized.

With continuing reference to FIG. 2, process gas can be, for example, introduced to processing region 45 through gas injection system 40. Process gas can, for example, include a mixture of gases such as Ar, Kr, Ne, He, CF4, C4F8, C4F6, C5F8, O2, H2, N2, Cl2, SF6, HBr, CO, HF, NH3, etc. Gas injection system 40 includes a showerhead, where process gas is supplied from a gas delivery system (not shown) to the processing region 45 through a gas injection plenum (not shown), a series of baffle plates (not shown) and a multi-orifice showerhead gas injection plate (not shown).

Vacuum pump system 58 can, for example, include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) is coupled to the process chamber 16. The pressure measuring device can be, for example, a Type 628B Baratron absolute capacitance manometer commercially available from MKS Instruments, Inc. (Andover, Mass.).

Figure 3:
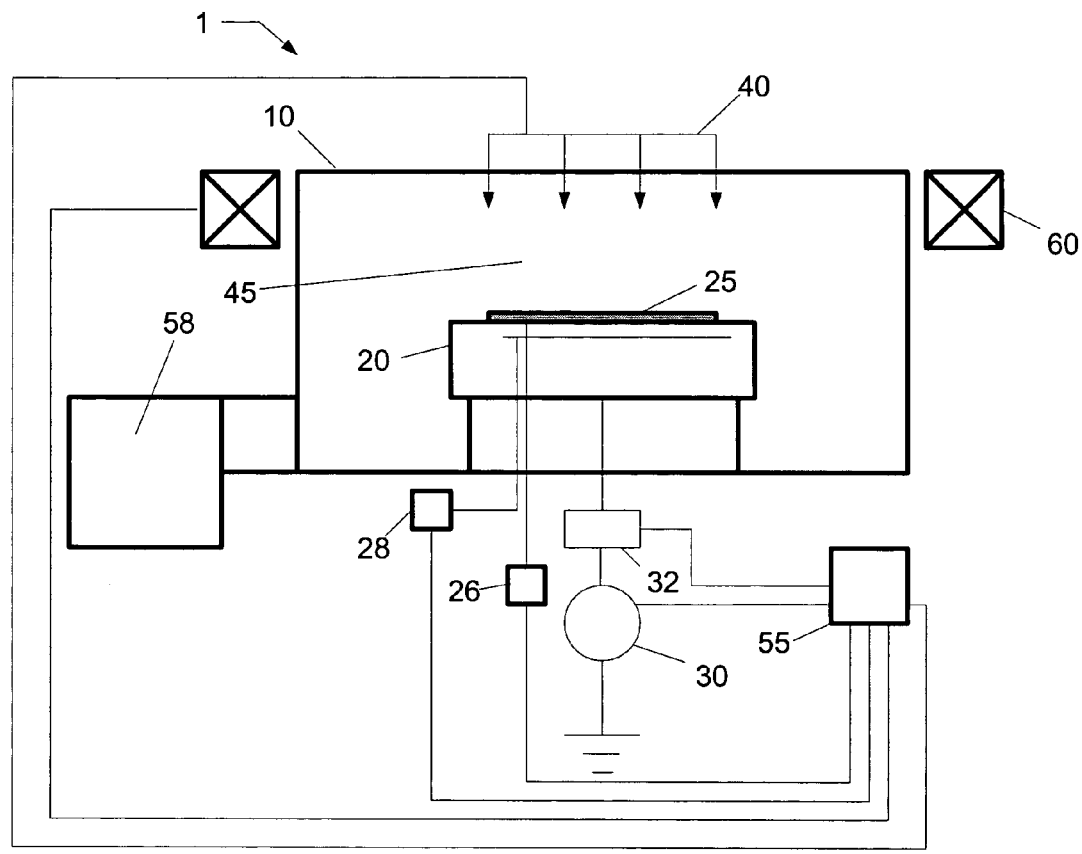
FIG. 3 presents an expanded cross-sectional view of a portion of a substrate holder for a plasma processing system according to an embodiment of the present invention.

As shown in FIG. 3, material processing system 1 can include a magnetic field system 60. For example, the magnetic field system 60 can include a stationary, or either a mechanically or electrically rotating DC or AC magnetic field in order to potentially increase plasma density and/or improve material processing uniformity. Moreover, controller 55 can be coupled to magnetic field system 60 in order to regulate the field strength or speed of rotation.

Figure 4:
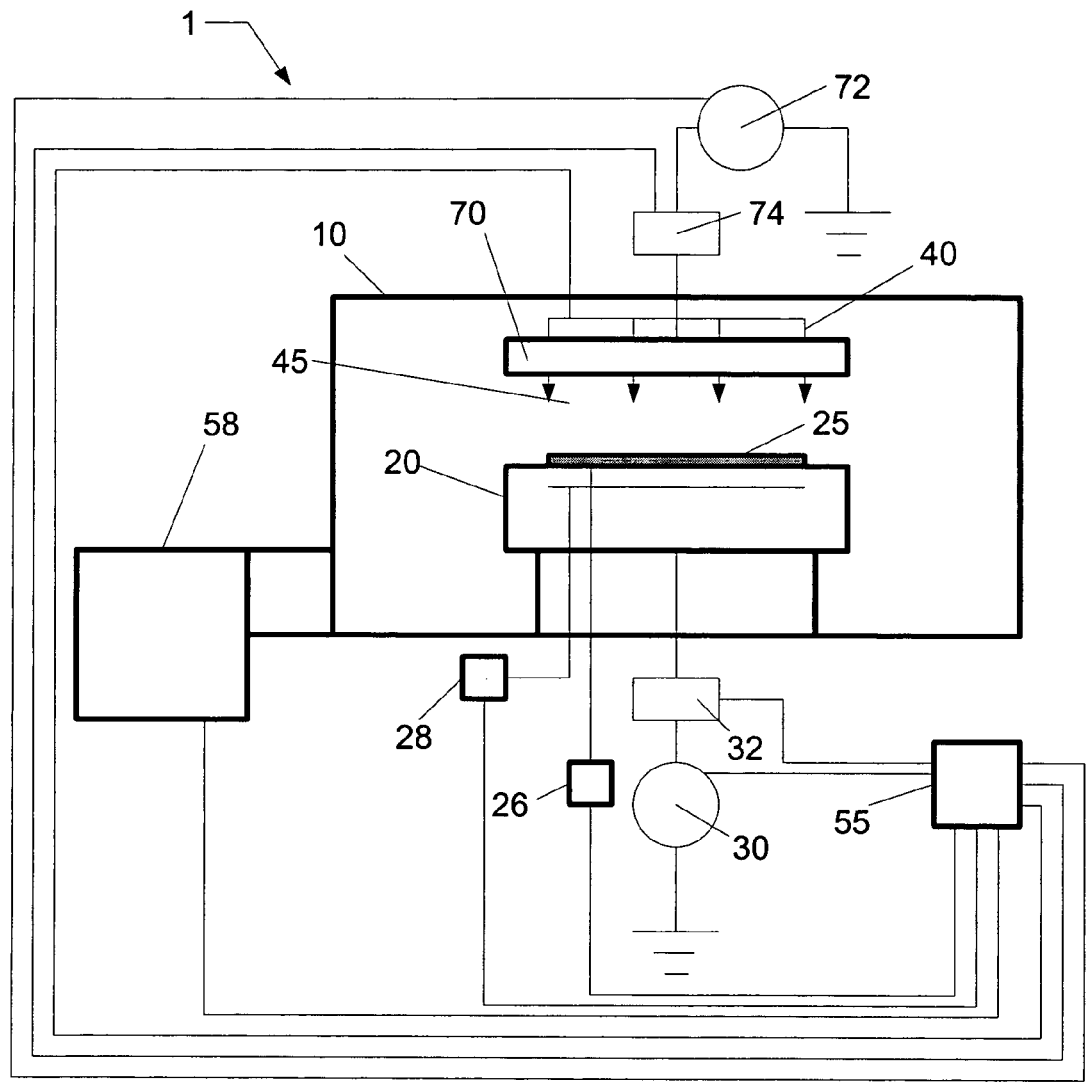
FIG. 4 presents an expanded cross-sectional view of a portion of a substrate holder for a plasma processing system according to an embodiment of the present invention.

As shown in FIG. 4, the material processing system can include an upper electrode 70. For example, RF power can be coupled from RF generator 72 through impedance match network 74 to upper electrode 70. A frequency for the application of RF power to the upper electrode preferably ranges from 10 MHz to 200 MHz and is preferably 60 MHz. Additionally, a frequency for the application of power to the lower electrode can range from 0.1 MHz to 30 MHz and is preferably 2 MHz. Moreover, controller 55 can be coupled to RF generator 72 and impedance match network 74 in order to control the application of RF power to upper electrode 70.

Figure 5:
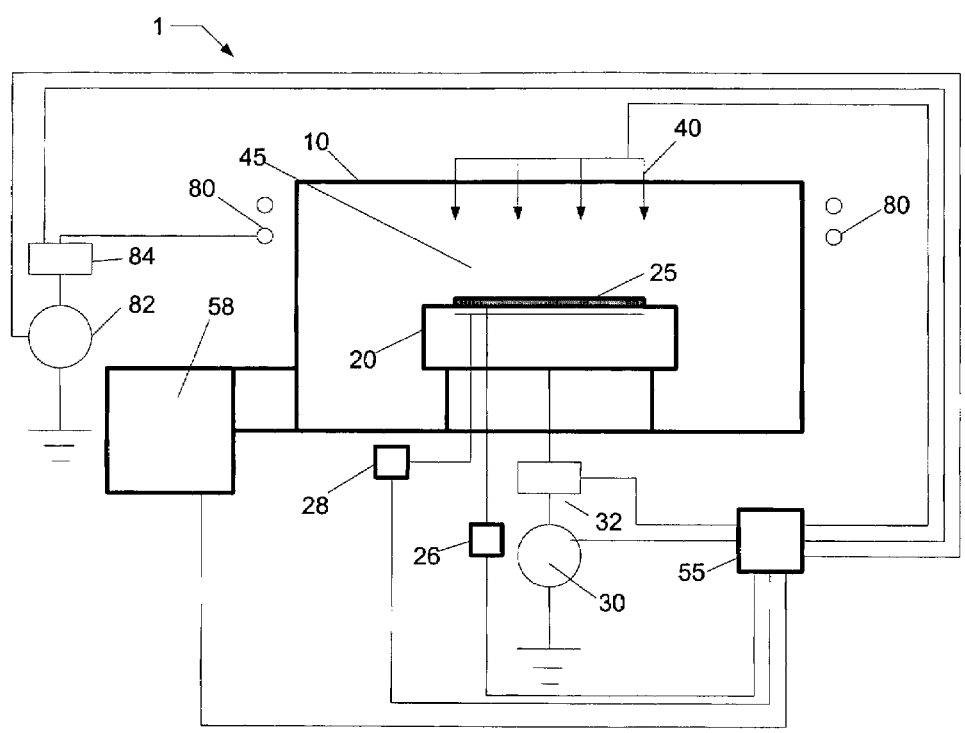
FIG. 5 presents an expanded cross-sectional view of a portion of a substrate holder for a plasma processing system according to an embodiment of the present invention.

As shown in FIG. 5, the material processing system of FIG. 1 can include an inductive coil 80. For example, RF power can be coupled from RF generator 82 through impedance match network 84 to inductive coil 80, and RF power can be inductively coupled from inductive coil 80 through dielectric window (not shown) to plasma processing region 45. A frequency for the application of RF power to the inductive coil 80 preferably ranges from 10 MHz to 100 MHz and is preferably 13.56 MHz. Similarly, a frequency for the application of power to the chuck electrode preferably ranges from 0.1 MHz to 30 MHz and is preferably 13.56 MHz. In addition, a slotted Faraday shield (not shown) can be employed to reduce capacitive coupling between the inductive coil 80 and plasma. Moreover, controller 55 can be coupled to RF generator 82 and impedance match network 84 in order to control the application of power to inductive coil 80. In an alternate embodiment, inductive coil 80 can be a "spiral" coil or "pancake" coil in communication with the plasma processing region 45 from above as in a transformer coupled plasma (TCP) reactor.

Alternately, the plasma can be formed using electron cyclotron resonance (ECR). In yet another embodiment, the plasma is formed from the launching of a Helicon wave. In yet another embodiment, the plasma is formed from a propagating surface wave.

In each of the systems of FIGS. 1–5, an endpoint detection system can be utilized to monitor the progress of an etch process. However, many real-time industrial processes experience failures because they do not correct problems at the time of their occurrences (i.e., while the process is ongoing). Statistical process control (SPC) helps alleviate this problem by examining the process itself in a statistical sense using real-time or near real-time measurements. By doing so, SPC demonstrates the overall characteristics of the process and is better suited to sense when the process is veering out of control.

For an SPC process, plural, statistically independent, random samples are generally taken at equal time increments. Controlling the amount of data sampled and the time between samples facilitates control chart monitoring. Depending on the equipment used and the rate of change in measured data, a balance is to be struck to prevent collecting too much or too little data. SPC generates a control chart by collecting the data, calculating the control limits, and reducing special causes of variations in the tabulations. This cycle is then repeated. The use of SPC in the context of semiconductor processing relies on the fact that a properly controlled environment can generate quality products that meet required standards. Software tools and electronic hardware are necessary to collect and monitor the data in (near) real-time. The monitoring process must be able to calculate and display charts in a reasonable amount of time. A thorough knowledge of manufacturing and control charts increases the effectiveness of SPC by enabling the cause of erroneous results to be identified and addressed.

Two types of statistical charts assist in monitoring whether a process is within its design constraints: the $\overline{X}$ chart and the R chart. The $\overline{X}$ chart is based on the averages of the random samples taken from variables of the monitoring process. When monitoring a process, the means of samples demonstrate when a process is out of control with greater ease and reliability than using individual measurements. Individual measurements are not able to illustrate the extent to which the total process is out of control. In other words, the means of the samples are more sensitive to change than individual results, and provide a greater understanding of the entire system. The $\overline{X}$ charts are useful for machine dominant processes since they demonstrate a good statistical variation of the process. Even though the $\overline{X}$ charts have complex calculations, they often produce more accurate results than systems which rely upon human inspection.

On the other hand, R control limits show the uniformity of a process. Errors exposed by the R charts are often caused by a change in personnel or by constant wear on the machinery, not by individual faults. Therefore, R charts often detect a need for system improvements relatively quickly.

According to the present invention, endpoint detection (EPD) is achieved using LIF and SPC control charts. The change point used for endpoint detection is fit to a Guassian distribution and set in a control chart. As more endpoint data is collected, a different distribution function may be set and applied to the SPC charts for setting the upper and lower control limits.

Figure 6:
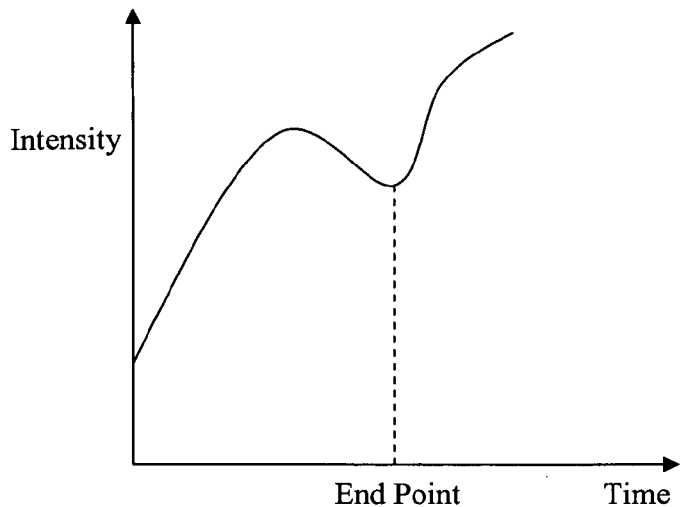
FIG. 6 is a simplified diagram displaying endpoint detection using LIF measurements.
Figure 7:
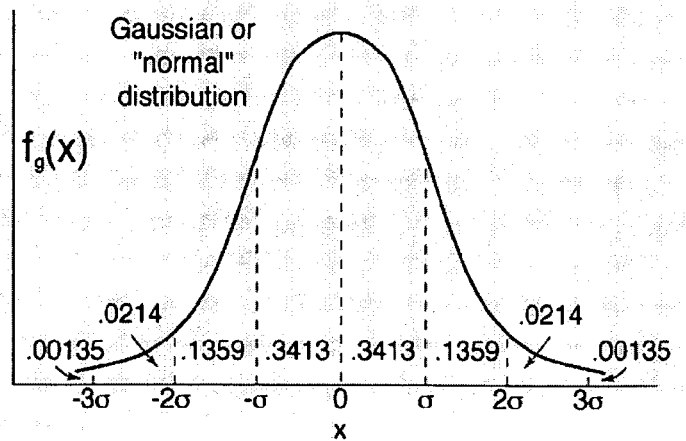
FIG. 7 displays a Gaussian distribution function.

The endpoint of an etching process using LIF is generally detected by a process engineer observing a change point (e.g., as shown in FIG. 6) or by timing the etching process. The initial time measurements from the etching process are collected in subgroups for the $\overline{X}$ SPC chart and fit to a Gaussian distribution curve (e.g., as shown in FIG. 7). A subgroup data point is the average of multiple endpoint detection times used to form an $\overline{X}$ SPC chart. The mean and standard deviation of the subgroups (time measurements from endpoint detections) are calculated and set to a Gaussian distribution function (e.g., $f_g(x)$ as shown in (1) below, where $\alpha$ is the mean and $\sigma$ is the standard deviation of the data collected).

$$f_g(x) = \frac{1}{\sqrt{2\pi\sigma^2}} e^{\frac{-(x-a)^2}{2\sigma^2}} \qquad (1)$$

Once the standard deviation has been determined for the endpoint detection subgroup data points, the upper and lower control limits on the SPC chart are set to $+3\sigma$ and $-3\sigma$, respectively. The $\pm 3\sigma$ control limits represent the normal limits (or 99.7%) of the population of subgroups. Any plot points beyond the control limits suggest a special cause of variation. The SPC chart upper and lower control limits can be tightened, e.g., $\pm 2\sigma$ represents 95.45% of a normal population, while $\pm 1\sigma$ represents 68.26% of a normal population.

After the initial Gaussian distribution fit, the third and fourth moments, skewness and kurtosis, respectively, are calculated for the subgroups. A Gaussian distribution has zero skewness since it is symmetric. Kurtosis measures the relative rate at which the distribution curve approaches zero from the mean. By calculating the third and fourth moments a better description of the distribution can be understood. A better description of the distribution is needed since $\pm 3\sigma$ set for the Gaussian distribution at 99.7% of the population may not be true for other distributions setting the control limits at $\pm 3\sigma$.

Figure 8:
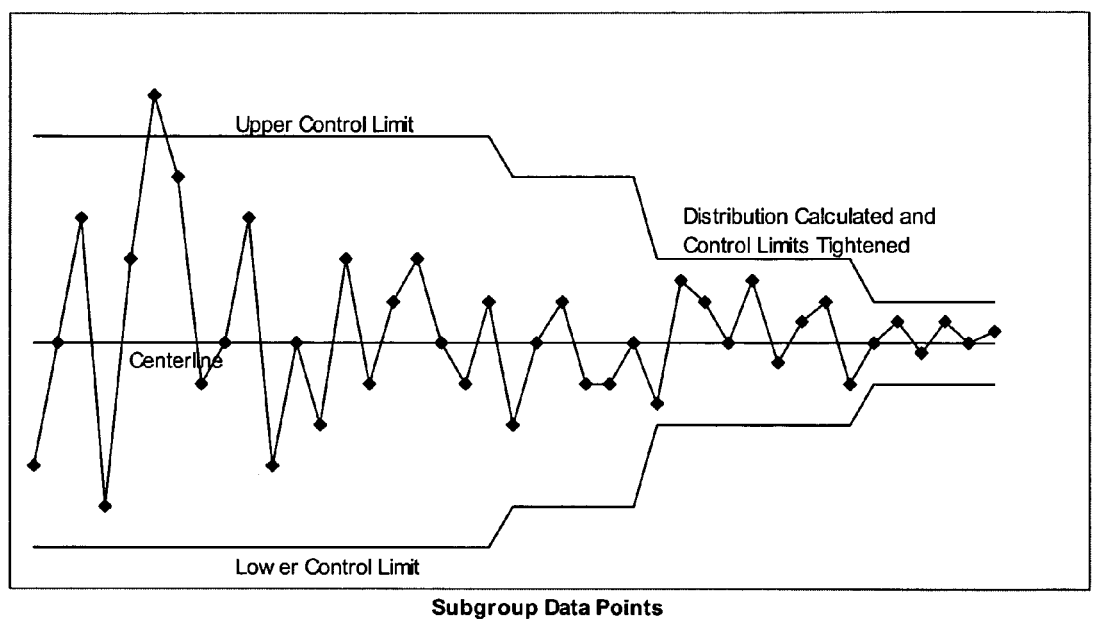
FIG. 8 illustrates a simplified diagram of a statistical process control chart with changing control limits.

Since the etching process is subject to slight drifts or changes in the processing parameters a moving window is used to calculate the moments of the subgroups. After N subgroups are collected, previous subgroups are discarded as new subgroup data is collected. The process of checking the distribution and tightening the control limits leads to improved endpoint detection as shown in FIG. 8.

Figure 9:
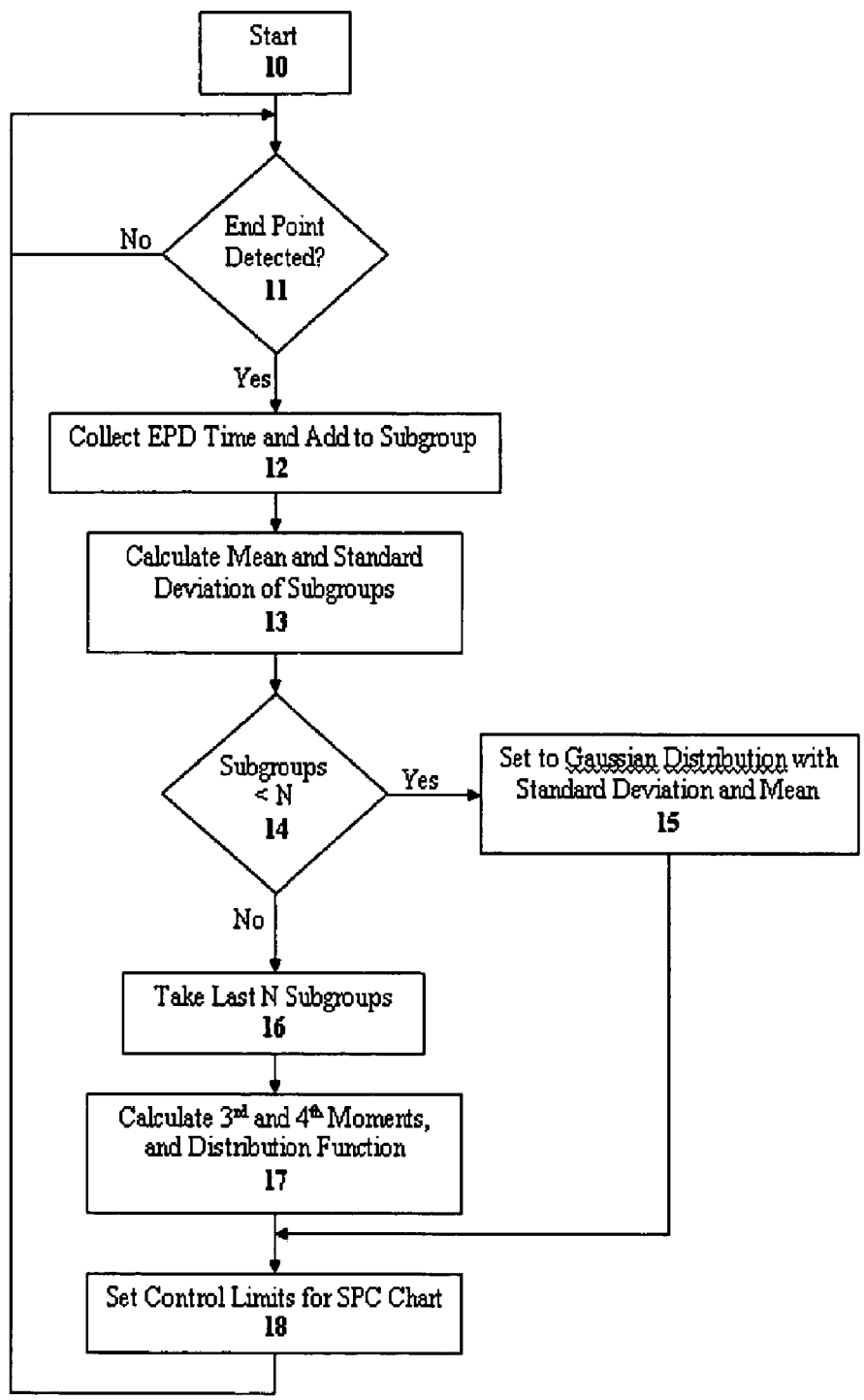
FIG. 9 illustrates a flow diagram of the software implementation.

FIG. 9 is a flow diagram demonstrating the process of setting control limits for endpoint detection, starting with step 100. If an endpoint in the process is detected in step 110, the time of the etching process is collected and added to a subgroup in step 120. The mean and standard deviation of the subgroups is calculated in step 130. If step 140 determines that less than N subgroups exist, then step 150 sets the distribution to be a Gaussian distribution. If step 140 determines that at least N subgroups exist, then step 160 constrains the subgroups to be used to the last N subgroups, and the third and fourth moments are calculated in step 170. From the moments, the system can determine if a new distribution function should be applied. Finally, the control limits are set for the $\overline{X}$ SPC chart in step 180.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A method of monitoring a semiconductor process comprising:
   obtaining measurements from an ongoing semiconductor process using laser interferometry to detect an endpoint for the semiconductor process;
   generating at least one control chart using statistical process control techniques during the ongoing semiconductor process in order to derive, from an analysis of multiple endpoints, control limits for the semiconductor process; and
   determining if the ongoing semiconductor process is operating within the control limits.

2. The method as claimed in claim 1, wherein the step of generating at least one control chart comprises generating an $\overline{X}$ chart.

3. The method as claimed in claim 1, wherein the step of generating at least one control chart comprises generating an R chart.

4. The method as claimed in claim 1, wherein the ongoing semiconductor process is an etch process.

5. The method as claimed in claim 1, wherein the step of determining if the ongoing semiconductor process is operating within control limits comprises adjusting the control limits during the ongoing process.

6. The method as claimed in claim 1, wherein the step of determining if the ongoing semiconductor process is operating within control limits comprises utilizing progressively restrictive control limits during the ongoing process.

7. The method as claimed in claim 1, wherein:

the generating derives from an average of the multiple endpoints said control limits for the semiconductor process, and the determining uses the derived control limits to determine if the ongoing semiconductor process is operating within design constraints.

* * * * *